United States Patent [19]

Robinson et al.

[11] Patent Number: 5,150,177
[45] Date of Patent: Sep. 22, 1992

[54] SCHOTTKY DIODE STRUCTURE WITH LOCALIZED DIODE WELL

[75] Inventors: Murray J. Robinson, Falmouth; Christopher C. Joyce, Gorham; Tim W. Luk, Scarborough, all of Me.

[73] Assignee: National Semiconductor Corporation, Santa Clara, Calif.

[21] Appl. No.: 803,214

[22] Filed: Dec. 6, 1991

[51] Int. Cl.⁵ ............................................. H01L 29/48
[52] U.S. Cl. ....................................... 357/15; 357/90; 357/43; 357/67
[58] Field of Search .................... 357/15, 43, 90, 67 S, 357/15 A, 15 P, 15 R

[56] References Cited

U.S. PATENT DOCUMENTS

| | | | |
|---|---|---|---|
| 4,604,790 | 8/1986 | Bonn | 357/43 X |
| 4,752,813 | 6/1988 | Bhatia et al. | 357/15 |
| 4,799,098 | 1/1989 | Ikeda et al. | 357/43 |
| 4,807,010 | 2/1989 | Winnerl et al. | 357/15 X |
| 4,943,742 | 7/1990 | Fukushima | 357/15 X |

FOREIGN PATENT DOCUMENTS 0194659  4/1989  Japan ..................... 357/43

*Primary Examiner*—William Mintel
*Attorney, Agent, or Firm*—Chris A. Caseiro; Daniel H. Kane, Jr.; James W. Rose

[57] ABSTRACT

An improved Schottky diode structure (4) is formed by retrograde diffusing an N+ concentration of relatively fast diffusing atoms, preferably Phosphorus atoms, to form a localized diode NWell (6) as the diode substrate for the diode. A buried diode layer (5) formed of relatively slow diffusing N type atoms, preferably Antimony atoms, underlies the diode NWell and electrically couples the diode junction (7) to the diode ohmic contact (9). A diode ohmic contact region (31) underlies the ohmic contact, further coupling the diode junction to the ohmic contact. Preferably, the diode junction is a Platinum-Silicide junction. The improved Schottky diode structure may be formed as part of a BICMOS integrated circuit fabrication process wherein the buried diode layer may be formed at the same time as a buried collector layer of a bipolar transistor structure, the diode NWell may be formed at the same time as an NWell of a CMOS transistor structure and the diode ohmic contact region may be formed at the same time as a collector sink region. In the BICMOS fabrication process the buried collector layer definition mask is also a buried diode layer definition mask, the retro NWell definition mask is also a diode NWell definition mask, the collector sink definition mask is also a diode ohmic contact region definition mask, and the BICMOS contacts definition mask is also a diode junction and ohmic contact definition mask.

12 Claims, 5 Drawing Sheets

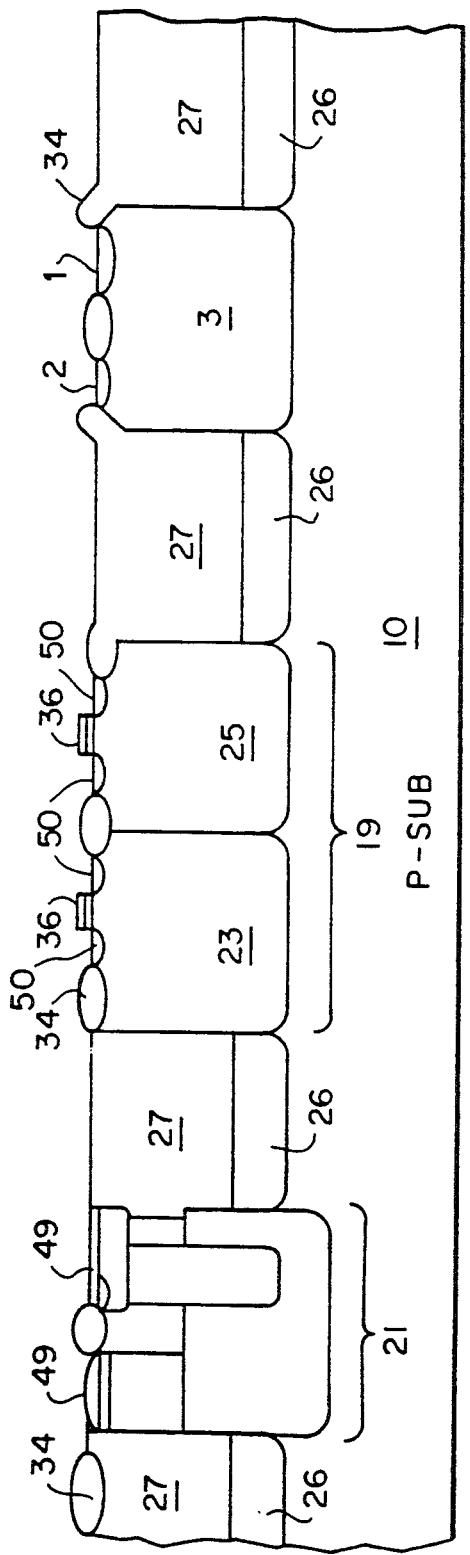
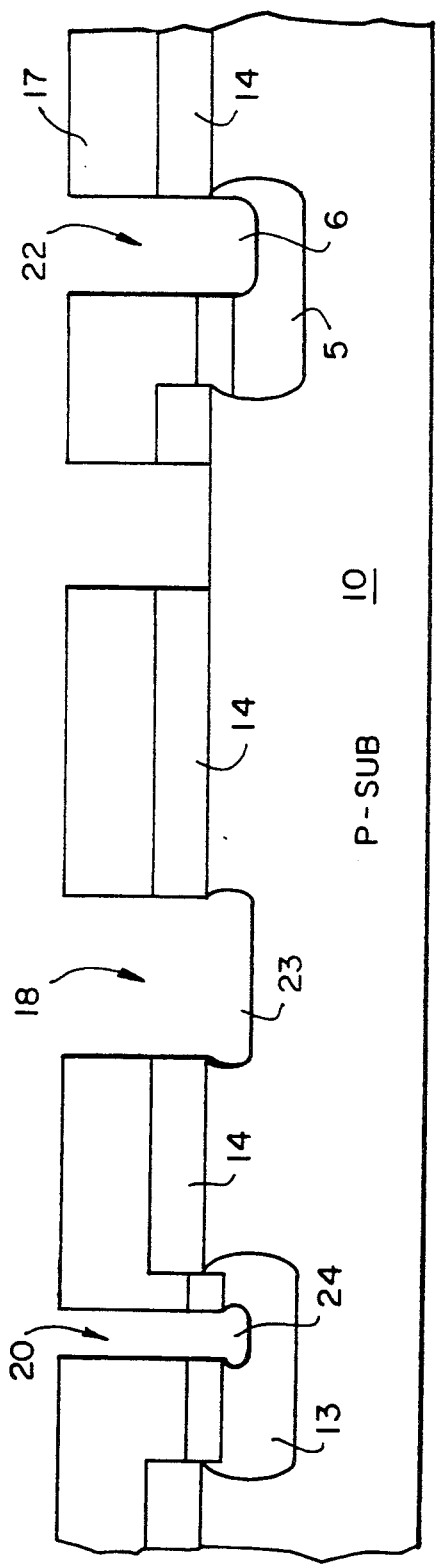
FIG. 1 (PRIOR ART)
FIG. 2

SCHOTTKY DIODE STRUCTURE WITH LOCALIZED DIODE WELL

TECHNICAL FIELD

The present invention relates to an improved Schottky diode structure incorporating a retrograde "NWell." In particular, the present invention is applicable to bipolar and BICMOS integrated circuits and it provides new bipolar and BICMOS fabrication processes for fabricating a faster, more reliable Schottky diode structure. More particularly, the present invention uses selected mask sequences from the bipolar transistor structure fabrication steps with modification of the masks according to the invention to form the improved Schottky diode structure and is directly applicable to platinum silicide Schottky diodes.

BACKGROUND ART

In the field of bipolar and BICMOS integrated circuits, junction diodes are used for a variety of well-known purposes. One such diode is the Schottky-type; that is, a junction diode comprising a metal in contact with the surface of a semiconductor material. Prior art Schottky devices of integrated circuits are typically formed by depositing the metal on the surface of an epitaxial layer of semiconductor material. The epitaxial layer is formed of single-crystal, N type semiconductor material deposited on a substrate of P type semiconductor material. In prior art devices this epitaxial layer is doped uniformly through the bulk, and has a surface concentration of about $1-2 \times 10^{16}$ donors/cc, resulting in a resistivity of about 0.5-2.0 ohm-cm at the metal-semiconductor interface. At this concentration the sheet resistance of the epitaxial layer is about 3400 ohms/sq and the required turn-on voltage, or the barrier height, for the Schottky diode is about 0.45 V @ 30 nA/sq. micron. This surface concentration yields a good low-reverse leakage diode. However, a number of problems exist with the prior art Schottky diodes for integrated circuits, principally related to high series resistance and wide variations in donor concentration along the current path under the active diode from one diode to the next.

As illustrated in FIG. 1, a cross-sectional view of a typical prior art Schottky diode configuration, it can be seen that the current path from the diode 1 to a contact 2 proceeds directly through the epitaxial layer 3. This epitaxial layer is doped with donor concentrations previously indicated by, for example, incorporating those donors into the deposition material, as has been described by Peltzer in U.S. Pat. No. 3,648,125. The donor concentration is essentially uniform at all depths for a given deposition sequence. While the $1-2 \times 10^{16}$ donors/cc surface concentration results in acceptable reverse current leakage and turn-on voltage characteristics, that same concentration throughout the bulk results in a relatively high pathway series resistance. This high series resistance means a slower-operating Schottky diode.

Another problem associated with prior art Schottky diode fabrication methods is a variation in donor concentration from one device to the next. For a number of reasons, donor concentrations can vary by as much as ±30% from one fabrication sequence to the next. Actual donor concentrations in the epitaxial layer are not known until after the deposition process has occurred. This fluctuation translates into performance variability for a given lot of fabricated diodes. This variability relates to the forward voltage drop and the reverse current leakage at the metal-semiconductor interface for the particular diode, in addition to the series resistance through the bulk of the epitaxial layer. That is, the forward voltage drop value, the reverse current leakage rate and the series resistance may vary from one diode to the next by as much as ±30%.

Recent innovations in integrated circuit bipolar NPN transistor structure fabrication methods have led to increasing localization and miniaturization of active areas. See, for example, co-pending application Ser. No. 07/655,676, of Robinson et al., filed Feb. 14, 1991, entitled Bipolar Transistor Structure and BICMOS IC Fabrication Process. Disclosed in that application is a new bipolar transistor structure and fabrication method that includes the incorporation of bipolar and CMOS fabrication steps. The process disclosed involves implanting relatively slow-diffusing N type atoms in the P type substrate so as to form a buried N+ collector layer for the bipolar structure, using a conventional collector mask, etch and implant sequence. Next, a sub-emitter collector region of relatively fast-diffusing N type atoms in an N++ concentration is implanted into a portion of the buried collector layer. At the same time, the same concentration of the same N type atoms is implanted in another portion of the P type substrate to form a retro NWell for a CMOS transistor structure. The simultaneous implant is provided by means of a retro NWell and sub-emitter collector mask, etch and implant sequence. The epitaxial layer of semiconductor material, with an N− concentration of donors, is then deposited on the substrate. This concentration, typically about $2 \times 10^{15}$ donors/cc, is made much less than N type atom concentrations in prior art epitaxial layers in order to minimize parasitic collector/base capacitance in the new bipolar structure and to localize sub-elements of the BICMOS integrated circuit.

After epitaxial layer deposition, subsequent thermal cycling causes the sub-emitter collector layer and the retro NWell of the CMOS structure to up-diffuse, or "retrograde diffuse" through the epitaxial layer by a well-defined pathway. This retrograde diffusion yields a donor concentration gradient through these localized areas of the epitaxial layer. Near the epitaxial layer surface the donor concentration is lowest; near the epitaxial layer/substrate interface the concentration is greatest.

Isolation regions of silicon dioxide are formed simultaneously in both the bipolar and CMOS transistor structures using a conventional active area mask, etch and growth sequence, to provide surface isolation between active areas. In the final stages of bipolar and CMOS transistor structure fabrication, contact deposition regions are formed through a contact definition mask, etch and deposition sequence, using a passivating silicon nitride layer as the mask. A first metal is then deposited in the contact regions, and a second metal layer is deposited over the first metal layer, wherein an interlayer dielectric may be formed so as to separate the two layers.

A disadvantage of the described prior art structure is that the relatively lightly-doped epitaxial layer is unsuitable for a Schottky diode. Specifically, a diode formed utilizing that substrate has a much higher turn-on voltage and higher reverse current leakage, due to the lower concentration of donors. In addition, the series resistance of the pathway through the epitaxial bulk is much higher for the same reason. Furthermore, the use of the low donor-concentration epitaxial layer as the Schottky diode substrate would still result in performance variability problems from one diode to the next because the deposition process remains the same and only the donor concentration is lower. Concentration variations as much as ±30% can still occur and with that diode performance characteristics can vary as well.

Therefore, what is needed is an improved Schottky diode with good low-reverse leakage and a relatively low turn-on voltage. What is also needed is a Schottky diode that has a relatively low-resistance current path through the bulk of the semiconductor material. Further, what is needed is a Schottky diode that is applicable for bipolar and BICMOS integrated circuits. Still further, what is needed is a new BICMOS fabrication process that includes the fabrication of the new Schottky diode using BICMOS mask sequences modified to include the formation of the new Schottky diode. Furthermore, what is needed is a Schottky diode fabrication process incorporated into a BICMOS fabrication process that results in reduced diode characteristic variability from one diode to another. Therefore, what is needed is to provide new mask structures and new mask, etch, implant and oxidation sequences for fabricating the new Schottky diode coupled to a BICMOS transistor structure without increasing the number of BICMOS processing steps.

OBJECTS OF THE INVENTION

It is therefore an object of the present invention to provide an improved Schottky diode with good low-reverse leakage, a relatively low turn-on voltage, and a relatively low-resistance current path through the bulk of the diode substrate. The invention utilizes a retro NWell in the epitaxial layer to form the substrate of the Schottky diode, wherein a relatively low concentration of donors at the diode junction provides low-reverse leakage and a relatively low voltage turn-on, and a relatively high concentration of donors in the bulk of the retro NWell provides a low series resistance for the current path from the junction to the diode contact.

Another object of the present invention is to provide improved bipolar and BICMOS integrated circuits by incorporating the fabrication of the improved Schottky diode into the fabrication of bipolar and BICMOS integrated circuits. The invention includes the fabrication of the new Schottky diode using bipolar and BICMOS mask sequences modified to include the formation of the new Schottky diode. Forming the diode substrate in the same manner as the retro NWell of a CMOS transistor structure yields Schottky diodes of more uniform performance characteristics from one diode to the next because the donor concentration can be more tightly controlled in the formation of the NWell than it can in the formation of the epitaxial layer.

Still another object of the present invention is to provide new mask structures and new mask, etch, implant and oxidation sequences for fabricating the new Schottky diode coupled to a bipolar or BICMOS transistor structure without increasing the number of processing steps.

DISCLOSURE OF THE INVENTION

The present invention achieves the above objectives by providing a retrograde well as the Schottky diode substrate, as well as a buried diode layer further reducing series resistance, a diode junction and a diode ohmic contact, wherein the well comprises semiconductor material that has essentially the same, or a slightly higher, concentration of donors at the diode junction when compared to prior art Schottky diode substrates. This concentration, generally about $1-3 \times 10^{16}$ donors/cc, results in a good, low-reverse leakage diode with a turn-on voltage in the range of about 425-450 mV @ 30 nA/sq.micron. The retrograde substrate well has a steadily increasing concentration of such donors down through the substrate bulk. This increasing concentration reduces the series resistance of the current path from the diode junction to its contacts through that bulk. Near the interface between the diode substrate well and an underlying substrate, the donor concentration exceeds $1 \times 10^{17}$ donors/cc. When the interface concentration exceeds about $5 \times 10^{17}$ donors/cc, the structure acts as an ohmic contact rather than a diode. The increasing donor concentration in the well of the present invention yields an average sheet resistance through the bulk of about 400 ohms/sq., as compared to a typical sheet resistance of about 3400 ohms/sq. for prior art diode substrates. This much lower series resistance means a faster current path from the diode junction, down through the retrograde well, into the buried diode layer, and back up to the diode ohmic contact, resulting in a much faster Schottky diode. Utilization of a retrograde well of a known donor concentration and controlled up-diffusion provides a Schottky diode substrate of well-defined characteristics and of minimal concentration fluctuations from one diode to the next. This tighter control results in more reliable diodes with repeatable characteristics over a plurality of diodes.

The invention also provides improved bipolar and BICMOS integrated circuits by incorporating the fabrication of the improved Schottky diode into bipolar and BICMOS fabrication sequences. Specifically, the bipolar structure includes a buried collector layer of relatively slow-diffusing N type atoms formed in a substrate of P type semiconductor material. A "well" of relatively fast-diffusing N type atoms in an N+ concentration is subsequently implanted into a portion of the buried collector layer. This well of relatively fast-diffusing atoms forms the localized sub-emitter collector region that later up-diffuses into the epitaxial layer deposited over the entire substrate. The localized sub-emitter collector region underlies the emitter and active base layer of the bipolar transistor substrate. According to the present invention, the improved Schottky diode is formed by using a buried collector layer and a sub-emitter collector region, as well as a diode sink region, wherein the localized sub-emitter collector region is permitted to up-diffuse to the surface of the epitaxial layer to form a retro diode well with a donor concentration gradient as previously noted. The collector, active base layer, base and emitter are not formed in the portion of the improved structure comprising the new Schottky diode. Instead, the present invention incorporates only certain portions of the bipolar transistor fabrication process to provide the retro diode well and a buried diode layer of a type similar to the buried collector layer as the substrate for the Schottky diode, thereby replacing the epitaxial layer alone as the substrate. This is of importance in the particular bipolar fabrication process contemplated for as previously stated, the epitaxial layer of the present invention is very lightly doped and a Schottky diode using such an epitaxial layer as its substrate would require a higherthan-average turn-on voltage, and it would have a very high series resistance.

The present invention also provides an improved BICMOS integrated circuit incorporating the improved Schottky diode into an integrated circuit comprising the bipolar resistor structure described, as well as a CMOS transistor structure including complementary NMOS and PMOS transistor structures separated by field oxide regions formed by a field oxide mask, etch and oxidation sequence. According to the invention, a buried collector layer definition mask, etch and implant sequence, used to implant relatively slow-diffusing N type atoms, is modified to construct the buried collector layer definition mask to act not only as a buried collector layer definition mask, but also as a buried diode layer definition mask with a buried diode layer definition opening. Underlying the source, drain and channel regions of the PMOS transistor is an NWell initially formed in the P type semiconductor material substrate. This NWell is formed by simultaneously implanting the same relatively fast-diffusing N type atoms used to form the sub-emitter collector region by an NWell definition mask, etch and implant sequence. According to the invention, the new Schottky diode is fabricated by constructing the NWell definition mask to act not only as a sub-emitter collector definition mask, but as a diode NWell definition mask also, with a diode NWell defining opening over the buried diode layer of the improved bipolar structure.

The BICMOS process involves at least one annealing step after deposition of the relatively lightly-doped epitaxial layer, formation of the source, drain and channel regions of the CMOS transistor structure in that epitaxial layer, and formation of the collector, base and emitter regions of the bipolar transistor structure in the epitaxial layer. The annealing step produces the up-diffusion of the relatively fast-diffusing N type atoms implanted in the buried collector layer forming the sub-emitter collector region, the up-diffusion of the same relatively fast-diffusing N type atoms of the NWell of the CMOS transistor structure, and the up-diffusion of the same relatively fast-diffusing N type atoms distributed from the buried diode layer through the epitaxial layer to the surface of the epitaxial layer, thereby forming the diode NWell of the improved Schottky diode.

The fabrication of the improved Schottky diode as part of the BICMOS integrated circuit structure also involves the step of constructing a collector sink definition mask of the bipolar structure to form a diode ohmic contact region definition mask with a diode contact defining opening over a portion of the surface of the diode NWell. The diode ohmic contact region is formed using a collector sink mask, etch and implant sequence wherein the collector sink mask is constructed to act not only as a sink collector definition mask but also as a diode ohmic contact region definition mask with diode ohmic contact region defining opening. The diode ohmic contact region is thereby doped to an N+ concentration, in preparation of the diode ohmic contact, at the same time the bipolar collector sink region is implanted.

The diode junction and ohmic contact are formed by constructing a CMOS contacts definition mask to form a diode junction and ohmic contact definition mask with a diode junction and ohmic contact defining opening over portions of the surface of the diode N-well, wherein a junction/contact surface spacer—formed at the same time as the field oxide regions and collector/- base surface spacer regions—isolates the diode junction from the diode ohmic contact. In the preferred embodiment, the CMOS contacts, bipolar active area contacts and the diode junction and diode ohmic contact are formed by a CMOS contacts mask and deposition sequence wherein Platinum is deposited on the surface of the entire structure, thereby forming a platinum silicide composite in all regions containing doped semiconductor material.

The fabrication of the improved Schottky diode structure as part of the improved BICMOS integrated circuit is completed by constructing a Metal 1 definition mask as a diode Metal 1 definition mask including diode Metal 1 defining openings over the diode contact and diode junction regions.

In addition to the improved Schottky diode structure, the improved bipolar transistor structure, and the improved BICMOS integrated circuit, the present invention also provides new BICMOS integrated circuit photodefinition masks including the new buried collector layer definition mask also forming the new buried diode layer definition mask, a new retro NWell definition mask also forming the diode NWell definition mask, a new collector sink definition mask also forming the diode ohmic contact region definition mask, a new BICMOS contacts definition mask also forming the diode junction and ohmic contact definition mask, and a new Metal 1 definition mask also forming the diode Metal 1 definition mask.

BRIEF DESCRIPTION OF THE DRAWINGS

FIG. 1 is a simplified diagrammatic cross section view of a prior art Schottky diode structure in conjunction with a bipolar transistor structure.

FIG. 2 is a simplified diagrammatic cross section view of the 2.0 mask, etch and implant sequence of the BICMOS fabrication process showing the new 2.0 retro NWell definition mask with bipolar transistor sub-emitter collector region opening, NMOS transistor opening and the new diode NWell definition opening for the improved Schottky diode structure, as well as the buried diode layer.

DESCRIPTION OF PREFERRED EXAMPLE EMBODIMENTS AND BEST MODE OF THE INVENTION

Figure 8:
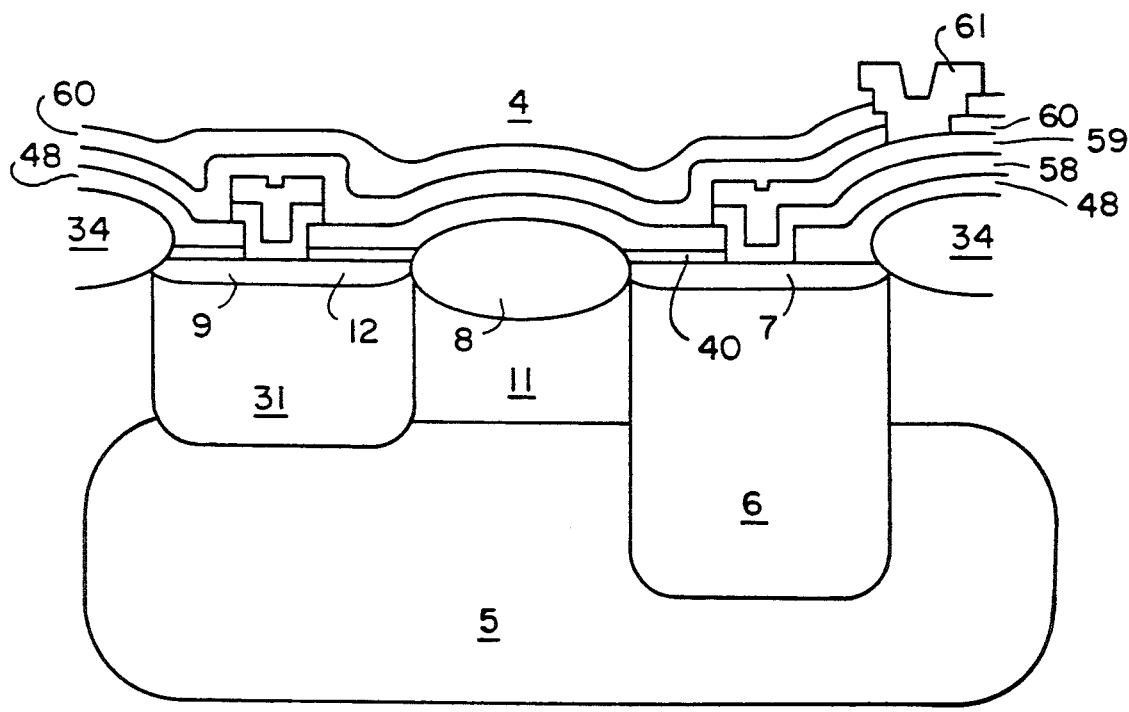
FIG. 8 is a simplified diagrammatic cross section view of the 15.0 Metal 1 definition mask illustrated in FIG. 7 without the photo resist mask over the contact regions and with leads extending from those regions.

An improved Schottky diode structure 4 according to the present invention comprises a buried diode layer 5, a retrograde diode NWell 6, a diode junction 7, a diode surface spacer 8 and a diode ohmic contact 9, as illustrated in FIG. 8. Said buried diode layer 5 and said retrograde diode NWell 6 form the substrate of said diode junction 7, thereby replacing said prior art epitaxial layer 3 of the prior art diode 1 illustrated in FIG. 1. Said diode NWell 6 provides a localized retrograde concentration of donors through the substrate underlying said diode junction 7 by the implantation of an N+concentration of relatively fast-diffusing Phosphorus atoms. Subsequent annealing drives the Phosphorus atoms up from a semiconductor substrate 10 of P type semiconductor material through a lightly doped epitaxial layer 11 of N type semiconductor material and up to an epitaxial layer surface 12.

Figure 9:
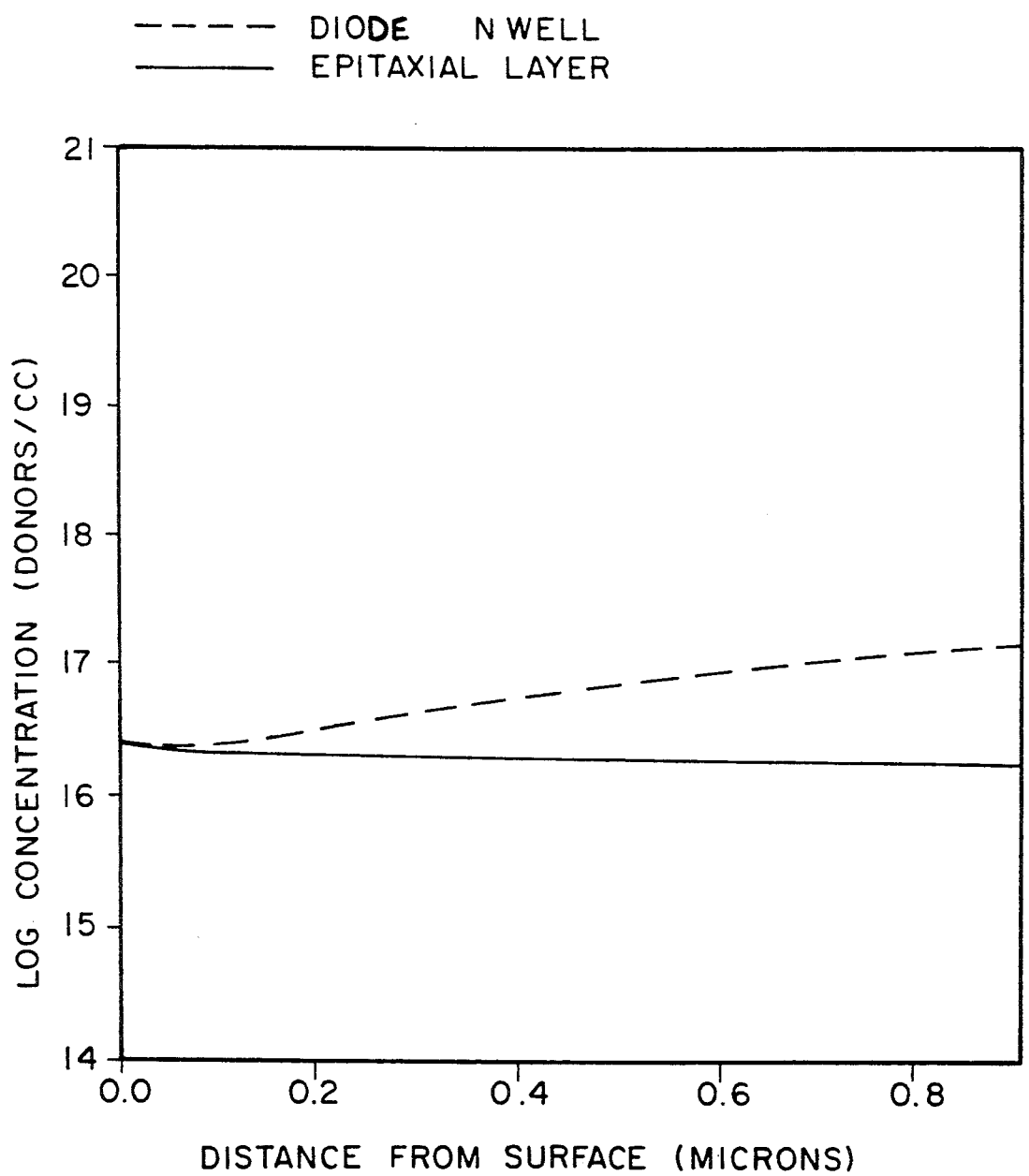
FIG. 9 is a graph illustrating the difference between donor concentrations from the surface down through the substrate underlying a Schottky diode junction for: 1) a prior art epitaxial layer substrate; and 2) the retrograde diode NWell substrate of the present invention.

Replacement of said prior art epitaxial layer 3 with said buried diode layer 5 and said diode NWell 6 increases the number of donors available in the substrate underlying said diode junction 7 by up to an order of magnitude. Furthermore, the donor concentration at said diode junction 7 is about $3 \times 10^{16}$ as compared to about $1-2 \times 10^{16}$ for a junction of said prior art diode 1. The advantage of the diode NWell is illustrated in FIG. 9 wherein the donor concentration increases down through the substrate bulk. This advantage results in a lower series resistance—the average sheet resistance through the bulk of said diode NWell 6 is 400 ohms/sq. versus 3400 ohms/sq. for said prior art epitaxial layer 3—thereby reducing the current path rate, resulting in a faster Schottky diode.

Said improved Schottky diode structure 4 may be fabricated utilizing either bipolar transistor structure or BICMOS integrated circuit fabrication processes. In the preferred embodiment, the steps of a BICMOS fabrication process utilized to fabricate said improved Schottky diode structure 4 are illustrated in FIGS. 2-8. New BICMOS mask structures are also presented in these figures. The complete BICMOS mask sequence into which the fabrication of said improved Schottky diode structure 4 has been incorporated, is as follows:

| Mask No. | Mask Function |
| --- | --- |
| 1.0 | Buried Collector Layer (BCL) Mask |
| 2.0 | Retro NWell Mask and Retro SEC Mask |
| 3.0 | Retro PWell/Channel Stop (CHST) Mask |
| 4.0 | Isolation Oxide (ISOX) Mask |
| 5.0 | Sink Implant & ISOX Gettering Mask |
| 6.0 | CMOS Active Area Definition Mask (Field Oxide Mask) & Collector Base Surface Spacer (CBSS) Definition Mask |
| 7.0 | Active Strip Mask |
| 8.0 | Poly Gate Definition Mask |
| 9.0 | Base Definition Mask |
| 10.0 | Nitride Etch Mask or Collector Base & Emitter Contact Definition Mask |
| 11.0 | Emitter & Collector Sink Implant Mask (Self-Aligned Transistor Mask) |
| 12.0 | P+ Source/Drain Mask (PMOS) |
| 13.0 | N+ Source/Drain Mask (NMOS) |
| 14.0 | CMOS Contact Definition Mask |
| 15.0 | Metal 1 (M1) Deposition Mask |
| 16.0 | VIA Mask (Inter Layer Dielectric Mask) |
| 17.0 | Metal 2 (M2) Deposition Mask |
| 18.0 | Passivation Mask |

A buried collector layer 13 and said buried diode layer 5 are first formed in said substrate 10 using the 1.0 BCL mask, etch and implant sequence. Relatively slow-diffusing N type Antimony atoms are implanted in said substrate 10 to an N+ concentration through an initial oxide layer 14. The 1.0 mask is formed to provide not only said buried collector layer definition mask with a buried collector defining opening 15, but also a buried diode layer definition mask with a buried diode layer opening 16 for said improved Schottky diode structure 4.

Referring to FIG. 2, a new NWell photoresist layer 17 is deposited to form the 2.0 retro NWell definition mask. The new 2.0 mask is formed to provide not only a retro NWell definition, etch and implant mask with a CMOS NWell opening 18 for a CMOS transistor structure 19, a sub-emitter collector region definition mask with an SEC opening 20 for a bipolar transistor structure 21, but also a diode NWell region definition mask with a diode NWell region opening 22 over said buried diode layer 5 for said improved Schottky diode structure 4. Relatively fast-diffusing Phosphorus atoms are implanted to an N+concentration through the new 2.0 mask to form, among other sub-elements, said diode NWell region 6.

Said diode NWell region 6 is localized within said buried collector layer 5 to underlay said diode junction 7. Specifically, said diode NWell 6 is arranged to be in vertical alignment with said diode junction 7, in substantially the same cross-sectional area. Phosphorus atoms are used for the N+concentration implant of said diode NWell region 6, as well as a CMOS NWell 23 and a sub-emitter collector region 24, for faster up-diffusion during subsequent annealing steps so as to provide retrograde concentrations extending into the subsequently deposited lightly-doped epitaxial layer 11.

The 3.0 mask, etch and implant sequence is used to define and implant a retro PWell region 25 of said CMOS transistor structure 19 and channel stop regions 26 adjacent to all structures. Boron atoms are implanted to a P+concentration in said regions 25 and 26. Said lightly-doped epitaxial layer 11, a single crystal layer of N type silicon, is then deposited uniformly over all structures in a blanket epitaxial deposition sequence without a mask.

Figure 3:
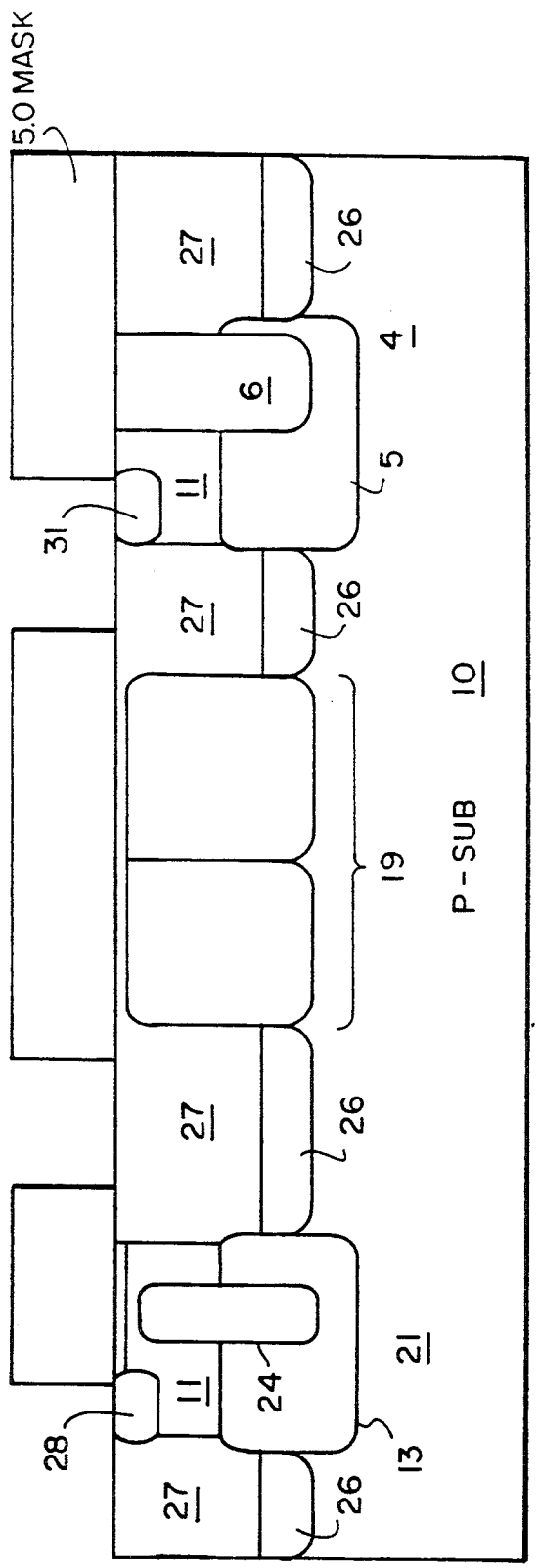
FIG. 3 is a simplified diagrammatic cross section view of the 5.0 mask, etch and implant sequence of the BICMOS fabrication process showing the new 5.0 collector sink implant definition mask with the collector sink implant opening and the new diode contact region definition opening for the improved Schottky diode structure.

Referring to FIG. 3, isolation oxide regions 27 are established around said CMOS transistor structure 19, said bipolar transistor structure 21 and said improved Schottky diode structure 4 using the 4.0 isolation oxide mask, etch and oxidation sequence. A collector sink region 28 is then formed in said epitaxial layer 11 using the 5.0 mask, etch and implant sequence. The 5.0 mask is formed to provide not only a collector sink definition and implant mask with a collector sink opening 29 for said bipolar transistor structure 21, but also a diode ohmic contact region definition mask with diode ohmic contact region opening 30 for said improved Schottky diode structure 4. Relatively fast-diffusing Phosphorus atoms in an $N^+$ concentration are implanted through the new 5.0 mask to form said collector sink region 28 of said bipolar transistor structure 19 as well as a diode ohmic contact region 31 forming the basis of said diode ohmic contact 9. The 5.0 mask is also formed for implanting said isolation oxide regions 27 with the same Phosphorus atoms to act as a gettering agent. A uniform nitride layer 32 is then deposited in a blanket chemical vapor deposition across all structures.

Figure 4:
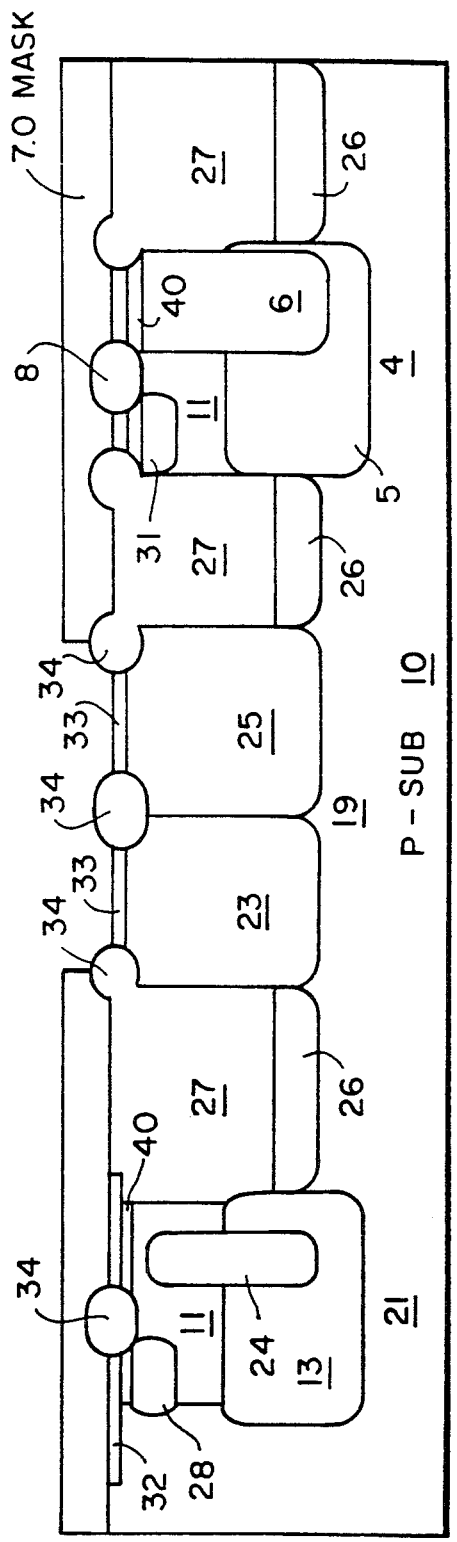
FIG. 4 is a simplified diagrammatic cross section view of the 7.0 mask and etch sequence of the BICMOS fabrication process showing the active areas of the CMOS transistor structure and the bipolar transistor structure, also showing the up-diffused diode NWell and the diode ohmic contact region of the improved Schottky diode.

Referring to FIG. 4, the 6.0 active mask is formed for etching said nitride layer 32 and defining CMOS active regions 33 of said CMOS transistor structure 19. Openings in the 6.0 mask define framing field oxide regions 34 for framing said CMOS transistor structure 19. In addition, the 6.0 mask functions as a collector/base surface spacer region definition mask for said bipolar transistor structure 21 and as a diode surface spacer definition mask used to form said diode surface spacer 8 in a subsequent oxidation sequence. Said diode surface spacer 8 acts to isolate said diode junction 7 from said diode ohmic contact 9.

In the 7.0 active strip mask steps said nitride layer 32 is stripped except over said bipolar transistor structure 21, and said CMOS active regions 33 are opened to expose said epitaxial layer 11, which is subsequently oxidized to form an epitaxial oxide layer 40. A gate oxide layer 35 is grown in said CMOS active regions 33 and a polycrystalline silicon layer is deposited over all structures in a blanket deposition. The 8.0 poly gate definition mask steps define CMOS gates 36 using a photoresist layer and photolithographic stepper followed by etching said poly silicon layer and leaving behind said gates 36. A thin spacer oxide is then grown over said gates 36 and an $N^-$ concentration of Phosphorus atoms is implanted through the 8.0 mask to develop a lightly doped drain region underlying said gates 36.

Figure 5:
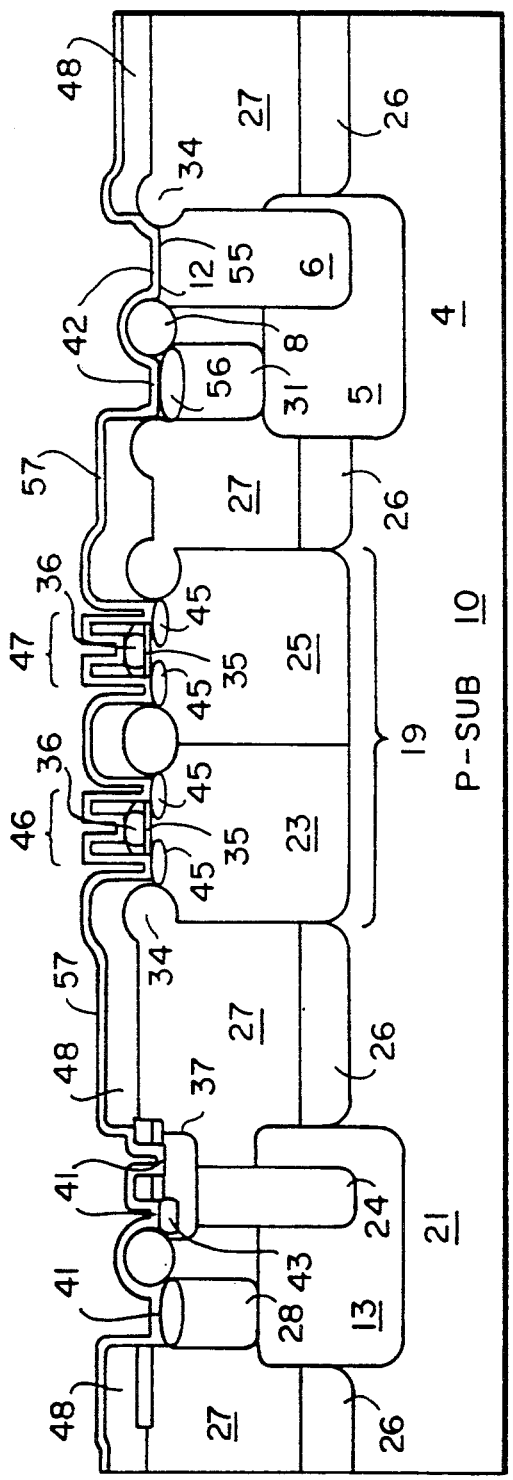
FIG. 5 is a simplified diagrammatic cross section view of the 14.0 contact define mask and etch sequence of the BICMOS fabrication process, showing the new 14.0 BICMOS contacts definition mask with the contact regions of the bipolar transistor and CMOS transistor structures and the new diode junction and ohmic contact definition opening for the improved Schottky diode, also showing the blanket Platinum deposition.

Referring to FIG. 5, the 9.0 mask, etch and implant sequence is used for defining and implanting a base region 37 of said bipolar transistor structure 21. The 10.0 nitride etch mask is formed to provide not only a collector, base and emitter contact definition mask with collector, base and emitter openings 38 for said bipolar transistor structure 21, but also diode junction and ohmic contact region openings 39. Said epitaxial oxide layer 40 remains over said bipolar transistor structure 21, with the 10.0 mask defining collector, base and emitter contact regions 41, and diode junction and ohmic contact regions 42 of said improved Schottky diode structure 4.

The 11.0 emitter and collector sink mask and implant step is utilized to further dope an emitter region 43 and said collector sink region 28 of said bipolar transistor structure 21 with an $N^+$ concentration of N type Arsenic atoms. The 11.0 mask is formed to provide not only the emitter and collector sink definition mask with emitter and collector sink openings, but also a second diode ohmic contact definition mask with a second diode ohmic contact opening 44 through which said Arsenic atoms in an $N^+$ concentration are implanted, further increasing the donor level of said diode ohmic contact region 31 to about $10^{20}$ donors/cc. While prior annealing steps initiated up-diffusion of said collector sink region 28, said diode ohmic contact region 31, said CMOS NWell 23 and said diode NWell 6, subsequent annealing completes development of the donor concentration profile throughout all of those regions. This full development includes the retrograde diffusion of said diode NWell 6 substantially to said epitaxial layer surface 12 in preparation of the formation of said diode junction 7 of said Schottky diode structure 4.

The 12.0 mask and implant and the 13.0 mask and implant sequences complete the formation of source and drain regions 45 of a PMOS structure 46 and an NMOS structure 47 of said CMOS transistor structure 19, respectively. Specifically, a $P^+$ concentration of Boron Difluoride is implanted through the 12.0 mask to form said source and drain regions 45 of said PMOS structure 46 and an $N^+$ concentration of Phosphorus atoms is implanted through the 13.0 mask to form said source and drain regions 45 of said NMOS structure 47. In both instances all other structures are masked. Following the 12.0 and 13.0 mask implants, a blanket low temperature oxide (LTO) layer 48 is deposited over all structures.

Referring to FIG. 5, said diode junction 7 and said diode ohmic contact 9 are formed by first depositing a new photoresist layer to form the 14.0 mask as part of the new 14.0 mask, etch and deposition sequence. The 14.0 mask is formed to provide not only the BICMOS contact definition mask with bipolar transistor structure contact openings 49 and CMOS transistor structure contact openings 50, but also a diode junction and ohmic contact definition mask with a diode junction opening 51 and an ohmic contact definition opening 52 for said improved Schottky diode structure 4.

Figure 6:
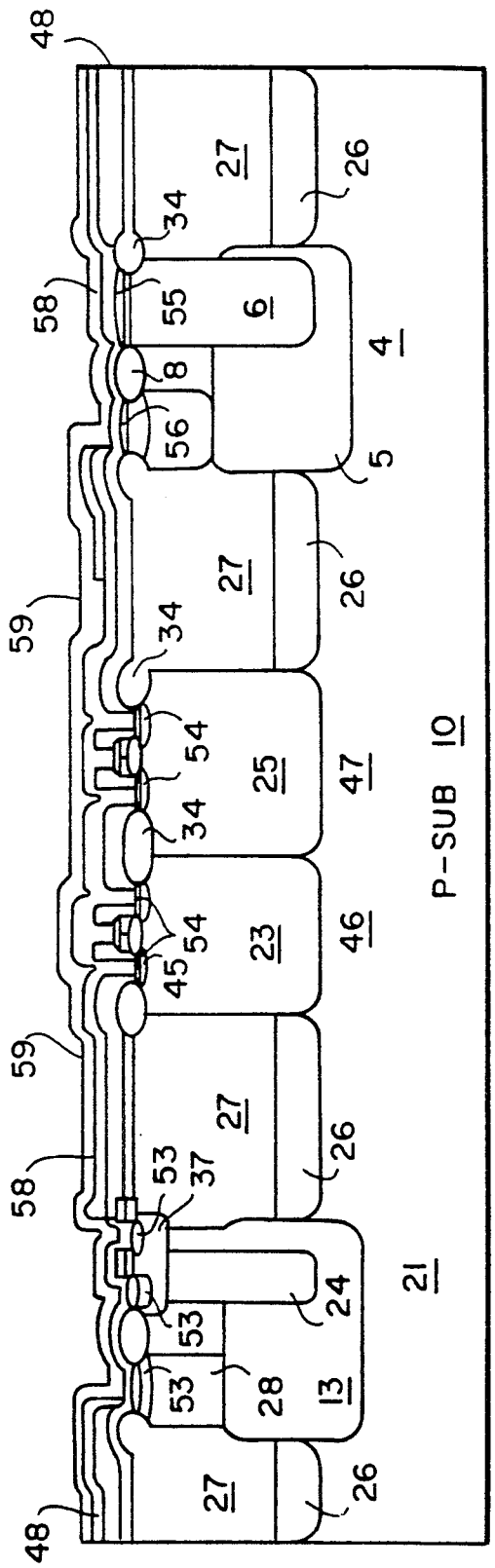
FIG. 6 is a simplified diagrammatic cross section view of the Metal 1 deposition sequence of the BICMOS fabrication process, showing the Titanium/Tungsten (Ti/W) and the Aluminum/Copper (Al/Cu) blanket deposition on all surfaces of the improved BICMOS integrated circuit.

Subsequent etching of said LTO layer 48 leaves bipolar transistor structure contact regions 53, CMOS transistor structure contact regions 54, a diode junction region 55 and a diode ohmic contact region 56. A blanket Platinum layer 57 is deposited on all structures and subsequent sintering forms a Platinum-Silicide composite at all of the exposed regions. For said improved Schottky diode structure 4, said Platinum-Silicide composite forms said diode junction 7 at said diode junction region 55 because the concentration of donors at said diode junction 7 is less than about $5 \times 10^{17}$. Said Platinum-Silicide composite forms said diode ohmic contact 9 at said diode ohmic contact region 56 because the concentration of donors is much greater than $5 \times 10^{17}$ and that region cannot act as a diode. A Ti/W blanket layer 58 and then an Al/Cu blanket layer 59 are deposited on all structure surfaces, as illustrated in FIG. 6. These metals form the basis of Metal 1 (M1) contacts for all active regions of said bipolar transistor structure 21, said CMOS transistor structure 19, and said improved Schottky diode structure 4.

Figure 7:
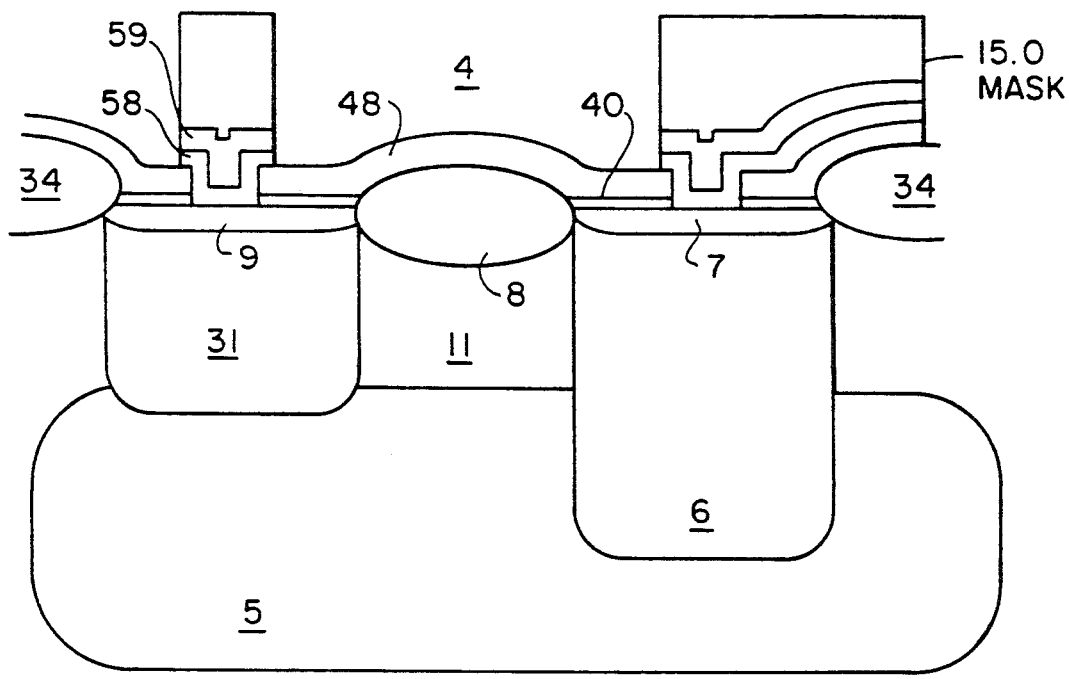
FIG. 7 is a simplified diagrammatic cross section view of the 15.0 mask and etch sequence of the BICMOS fabrication process showing a fragment of the new 15.0 Metal 1 definition mask with the new Metal 1 diode definition contacts for the improved Schottky diode structure and the photo resist mask over the contact regions.

Referring to FIG. 7, a section of the BICMOS structure illustrating said improved Schottky diode structure 4 is shown. A new photodeposit layer is deposited to form the 15.0 M1 mask. The new 15.0 mask is formed not only to provide openings for subsequent etching of said Ti/W blanket layer 58 and said Al/Cu blanket layer 59 over portions of said bipolar transistor structure 21 and said CMOS transistor structure 19, but also over portions of said improved Schottky diode structure 4 comprising said diode surface spacer 8. Referring to FIG. 8, following the etching of said M1 blanket layers 58 and 59, an interlayer dielectric 60 is deposited over all structures. Said interlayer dielectric 60 is masked and etched using the 16.0 VIA mask and etch sequence, followed by deposition of a second metal layer 61 using the 17.0 Metal 2 (M2) mask and deposition sequence. The final passivation etch and mask sequence cuts holes in said nitride layer 32 for bond pads.

While the invention has been described with reference to particular example embodiments, it is intended to cover all modifications and equivalents within the scope of the following claims.

We claim:

1. A Schottky diode structure comprising a diode junction and an ohmic contact formed in the surface of an epitaxial layer of semiconductor material deposited over a substrate, wherein the improvement comprises a diode NWell of N type atoms underlying said diode junction, electrically coupling said diode junction to said ohmic contact, wherein said N type atoms are distributed in a retrograde concentration upward from said substrate.

2. The Schottky diode structure as claimed in claim 1 further comprising a diode surface spacer positioned on a surface of said epitaxial layer between said diode junction and said ohmic contact, wherein said diode surface spacer isolates said diode junction from said ohmic contact at said epitaxial layer surface.

3. The Schottky diode structure as claimed in claim 1 further comprising an ohmic contact region underlying said ohmic contact and a buried diode layer underlying said diode NWell.

4. The Schottky diode structure as claimed in claim 3 wherein said ohmic contact region comprises a well of N type atoms and said buried diode layer comprises a well of N type atoms, wherein said well of N type atoms of said ohmic contact region is relatively fast diffusing with respect to said N type atoms of said buried diode layer.

5. The Schottky diode structure as claimed in claim 4 wherein said diode NWell comprises Phosphorus atoms, said N type atoms of said ohmic contact region are Phosphorus atoms and said N type atoms of said buried diode layer are Antimony atoms.

6. The Schottky diode structure as claimed in claim 1 wherein said diode junction is a Platinum-Silicide junction.

7. The Schottky diode structure as claimed in claim 5 wherein said diode NWell has a concentration of said Phosphorus atoms near said diode junction of about $3 \times 10^{16}$ atoms/cc and about $1 \times 10^{17}$ atoms/cc near said buried diode layer.

8. The Schottky diode structure of a BICMOS integrated circuit, said BICMOS integrated circuit comprising at least one bipolar transistor structure having collector, base and emitter regions formed in the surface of an epitaxial layer of semiconductor material deposited over a substrate, said bipolar transistor structure having a buried collector layer formed in said substrate underlying said collector, base and emitter regions, said buried collector layer comprising N type atoms separated from said base and emitter regions by said epitaxial layer, a collector sink region formed in said epitaxial layer electrically coupling said collector region with said buried collector layer and a sub-emitter collector region formed in said buried collector layer electrically coupling said base region with said buried collector region, said bipolar transistor structure being isolated in said BICMOS integrated circuit structure by isolation oxide regions and a collector/base surface spacer region separating said collector from said base: and at least one CMOS transistor structure having a retrograde NWell formed in said substrate and comprising N type atoms distributed in a retrograde concentration upward from said substrate into said epitaxial layer, said CMOS transistor structure being framed by field oxide regions, wherein both said bipolar transistor structure and said CMOS transistor structure comprise integrated BICMOS contact regions formed by sintering Platinum onto a surface of said epitaxial layer comprising an N++ concentration of N type atoms; said Schottky diode comprising:

a. a diode junction;
b. a buried diode layer;
c. a retrograde diode NWell;
d. an ohmic contact region; and
e. an ohmic contact, wherein said diode NWell is formed below said diode junction in said buried diode layer, said ohmic contact region is formed below said ohmic contact in said epitaxial layer, and said diode junction is electrically coupled to said ohmic contact through said diode NWell, said buried diode layer and said ohmic contact region, and wherein said improved Schottky diode is coupled to said BICMOS integrated circuit.

9. The Schottky diode structure of a BICMOS integrated circuit as claimed in claim 8 wherein said buried collector layer of said bipolar transistor structure and said buried diode layer of said improved Schottky diode structure are formed of Antimony atoms.

10. The Schottky diode structure of a BICMOS integrated circuit as claimed in claim 8 wherein said sub-emitter collector layer of said bipolar transistor structure, said retragrade NWell of said CMOS transistor structure and said diode NWell of said improved Schottky diode structure are formed of Phosphorus atoms.

11. The Schottky diode structure of a BICMOS integrated circuit as claimed in claim 8 wherein said Schottky diode structure further comprises a diode surface spacer located between said diode junction and said ohmic contact, wherein said diode surface spacer comprises field oxide.

12. The Schottky diode structure of a BICMOS integrated circuit as claimed in claim 8 wherein said diode junction comprises Platinum-Silicide.

* * * * *